(12) United States Patent
Maehara

(10) Patent No.: US 6,226,182 B1
(45) Date of Patent: May 1, 2001

(54) COOLING STRUCTURE OF ELECTRONIC APPLIANCE

(75) Inventor: Kenichi Maehara, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/569,149

(22) Filed: May 11, 2000

(30) Foreign Application Priority Data

May 12, 1999 (JP) .................................................. 11-130910

(51) Int. Cl.[7] .................................................. H05R 7/20
(52) U.S. Cl. .................. 361/695; 361/679; 361/687; 361/816; 361/818; 174/35 R; 211/41; 165/121
(58) Field of Search .................................... 361/679, 683, 361/685–687, 692–697, 702–707, 724, 727, 730, 732, 752, 754, 757, 746, 797, 802, 816, 818; 165/80.3, 80.4, 121, 125; 174/35 R; 220/9.1, 699, 669; 248/562, 566; 211/41, 26; 312/282, 314, 316, 107, 111

(56) References Cited

U.S. PATENT DOCUMENTS

| 4,926,291 | * | 5/1990 | Sarraf | 361/384 |
| 5,160,357 | * | 11/1992 | Faber | 55/385.2 |
| 5,282,114 | * | 1/1994 | Stone | 361/687 |
| 5,493,473 |   | 2/1996 | Yanagi . | |
| 5,808,866 | * | 9/1998 | Porter | 361/695 |

FOREIGN PATENT DOCUMENTS

| 87 03 954 | | 5/1987 | (DE) . | |
| 87 09 815 | | 9/1989 | (DE) . | |
| 2961858 | | 9/1988 | (JP) . | |
| 63-220600 | | 9/1988 | (JP) . | |
| 63-221699 | | 9/1988 | (JP) . | |
| 3-187296 | | 8/1991 | (JP) . | |
| 408264990A | * | 10/1996 | (JP) | H05K/7/20 |
| 409084225A | * | 3/1997 | (JP) | H02B/1/56 |
| 2895388 | | 3/1999 | (JP) . | |

* cited by examiner

*Primary Examiner*—Leo P. Picard
*Assistant Examiner*—Michael Datskovsky
(74) *Attorney, Agent, or Firm*—Ratner & Prestia

(57) ABSTRACT

Accumulation of heat in the electronic appliance is prevented, and the electronic appliance is cooled efficiently. Not requiring extra molded part as duct, the cost is saved. The noise level is lowered. This is a cooling structure for an electronic appliance having heat generating parts. The cooling structure includes a housing having a top panel, side panels, and a bottom panel, a case disposed in the housing, a circuit board disposed in the case, and a frame disposed in the space between the top panel and case. The circuit board has the heat generating parts. The space enclosed by the top panel, case and frame forms a wind tunnel. The heat generated in the heat generating parts is exhausted outside of the housing by the air passing through the wind tunnel. The case and the circuit board have the circuit board disposed in the housing, and a shield case disposed to cover the circuit board.

19 Claims, 1 Drawing Sheet

COOLING STRUCTURE OF ELECTRONIC APPLIANCE

FIELD OF THE INVENTION

The present invention relates to a cooling structure of an electronic appliance.

BACKGROUND OF THE INVENTION

An electronic appliance accommodating printed wiring boards on which various electronic components are mounted has been hitherto cooled by an exhaust fan installed in the housing, heat pipes, or other heat exchangers. Or by forcing out the heat by natural convection, the box-shaped electronic appliance has been cooled.

However, when the fan is directly mounted on the housing, the housing radiant noise increases due to fan rotation noise and wind sound. Therefore, if the electronic appliance for general household use has such fan, noise is generated, and therefore the electronic appliance having such fan is not suited as an electronic household appliance. On the other hand, in the structure incorporating the fan inside of the housing, molded parts must be newly added for exhausting the heat outside of the housing or taking in air. As a result, the manufacturing cost is higher. The electronic appliance having heat pipes or other heat exchangers, expensive heat countermeasure parts are needed. Therefore, because of high product cost, electronic appliances having such heat exchangers are not suited as electronic household appliances.

SUMMARY OF THE INVENTION

A cooling structure of an electronic appliance having heat generating parts of the invention comprises a housing having a top panel, side panels, and a bottom panel, a case disposed in the housing, a circuit board disposed in the case, and a frame disposed in the space between the top panel and case, in which the circuit board has heat generating parts, the space enclosed by the top panel, case and frame forms a wind tunnel, the space enclosed by the circuit board and the case forms an inner space, and the heat generated in the heat generating parts is exhausted outside of the housing by the air passing through the wind tunnel.

Preferably, the cooling structure further comprises a fan disposed in the case. The case and the circuit board have the circuit board disposed in the housing, and a shield case disposed to cover the circuit board. The frame has an elastic member. At least one of the top panel and the bottom panel has a cooling hole. The case has a first ventilation hole. The circuit board has a second ventilation hole.

In this configuration, the heat generated from the circuit board is easily exhausted outside of the housing. Accordingly, accumulation of heat in the electronic appliance is prevented. As a result, the electronic appliance is cooled efficiently. Since the wind tunnel functions as duct, other molded part as duct is not needed. Therefore, the cost is reduced. Since the ran rotates inside of the housing, leak of rotation noise generated by fan rotation to outside of the housing is prevented. As a result, the noise level is lowered.

REFERENCE NUMERALS

Figure 1:
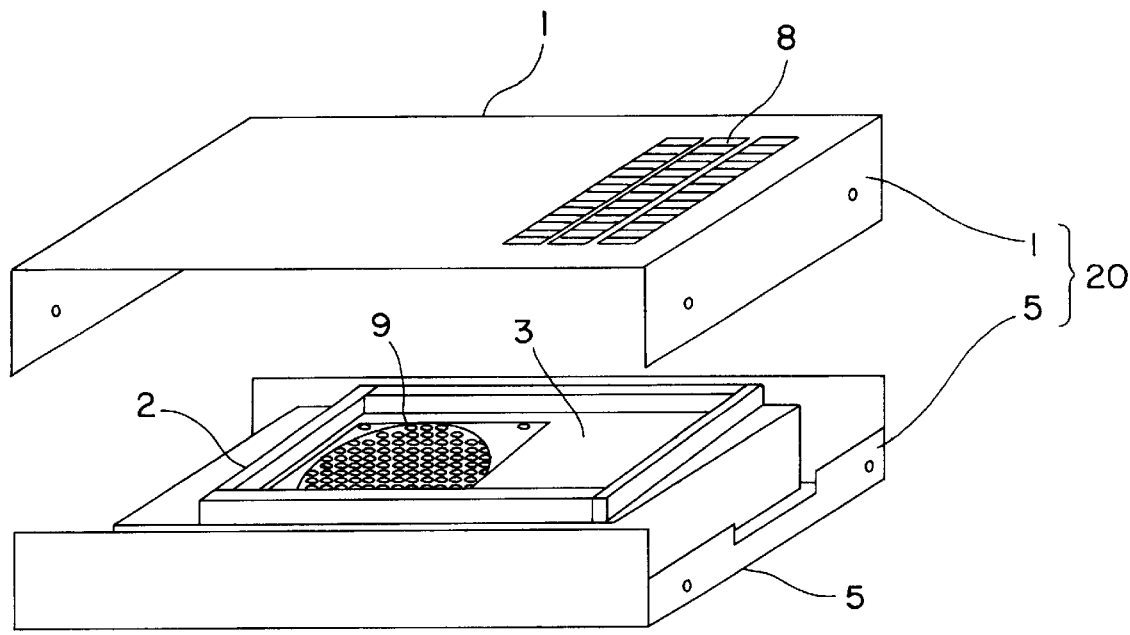
FIG. 1 is a perspective exploded view of a cooling structure an electronic appliance in an embodiment of the invention.

1 Top plate
2 Frame for wind tunnel
3 Shield case
4 Fan
5 Chassis (container with a bottom)
6 Circuit board
7 Heat generating part
8 First cooling hole
9 First ventilation hole
10 Second ventilation hole
20 Housing
21 Wind tunnel
22 Internal space
23 Lower space
24 Legs
51 Second cooling hole

DETAILED DESCRIPTION OF THE INVENTION

A cooling structure of an electronic appliance in one embodiment of the invention comprises a housing, a shield case for prevention of electromagnetic wave disposed inside of the housing, and an elastic member disposed between the housing and shield case, in which the space enclosed by the housing, shield case and elastic member forms a wind tunnel, and the wind tunnel functions as a cooling duct.

The elastic member has a function as a frame. The cooling structure further comprises a circuit board disposed in the housing. The shield case is disposed to cover the circuit board. The housing has side panels, a top panel, and a bottom panel, and at least one of the top panel and bottom panel has a cooling hole formed on its surface. The shield case has a first ventilation hole. The circuit board has a second ventilation hole. The shield case has a function of preventing electromagnetic waves. The circuit board has a control circuit. The circuit board further has various electronic components such as heat generating parts. The circuit board has, for example, a printed wiring board.

The elastic member has sponge member, rubber member, hollow rubber member, hollow resin member, resin ring, and rubber ring.

The cooling structure further includes a cooling fan mounted on the shield case. The shield case has an enclosed shape disposed on the circuit board. This fan has a function of exhausting the heat generated in the heat generating parts to outside of the housing through the wind tunnel. That is, the hot air released from the fan is exhausted outside of the housing without recirculating in the direction of the heat generating parts.

This constitution prevents leak of noise to outside of the housing. Further, it is not necessary to fabricated new molded part for duct, and the structure is simple. Owing to this simple structure, the high temperature air in the housing can be efficiently exhausted to outside of the housing.

That is, the shield case is formed in an enclosed type, and without internally circulating the air guided from the fan, the generated heat can be efficiently led outside of the housing. As a result, the electronic appliance is cooled efficiently. By installing the fan in the housing, external leak of noise can be reduced.

Referring now to the drawings, the cooling structure of the electronic appliance of the invention is described below in exemplary embodiments.

Exemplary Embodiment 1

Figure 2:
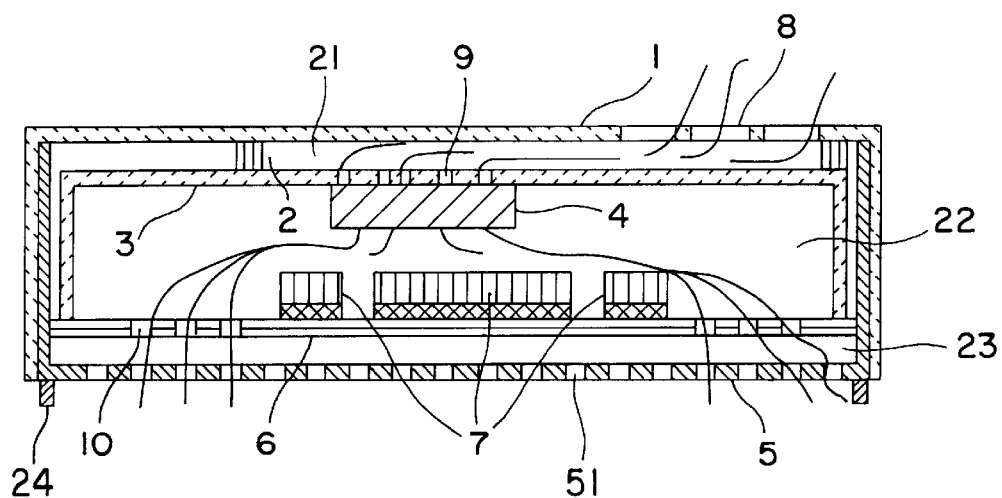
FIG. 2 is a side sectional view of the cooling structure own in FIG. 1.

FIG. 1 is a perspective exploded view of a cooling structure of an electronic appliance in an exemplary embodiment of the invention. FIG. 2 is a side sectional view of FIG. 1.

In FIG. 1 and FIG. 2, the cooling structure of the electronic appliance comprises a housing 20, a circuit board 6, a shield case 3, a fan 4, and a frame for wind tunnel 2. The housing 20 has a chassis 5 in a shape of a container with a bottom, and a top panel 1 for covering the chassis 5. The shield case 3 is placed on the circuit board 6 to cover the circuit board 6. The fan 4 has a function of exhausting the air in the housing 20 outside of the housing 20. The circuit board 6 has heat generating parts 7. A first cooling hole 8 is formed in the top panel 1. A first ventilation hole 9 is formed in the shield case 3. A second ventilation hole 10 is formed in the circuit board 6. A second cooling hole 51 is formed in the bottom of the chassis 5. The first cooling hole 8, first ventilation hole 9, second ventilation hole 10, and second cooling hole 51 have openings, and air can pass through the openings. Four projected legs 24 are disposed at under side of the chassis 5. A gap is formed at under side of the chassis 5. The air can pass through the gap and the second cooling hole 51. When the chassis 5 has the gap at under side of the chassis 5, the legs 24 are not always necessarily disposed. The heat generated in the circuit board 6 is exhausted outside of the housing 20 by passing of the air guided from fresh air. Thus, accumulation of heat in the electronic appliance is prevented, and the electronic appliance is cooled.

The frame for wind tunnel 2 is preferred to have a function of absorbing vibration. The frame for wind tunnel 2 has an elastic member. The elastic member is, for example, sponge member, rubber member, hollow rubber member, hollow resin member, resin ring, rubber ring, U-shaped concave resin, or U-shaped concave rubber.

The circuit board 6 is disposed in the bottom of the chassis 5. Various electronic components such as resistors, capacitors integrated circuits and other heat generating parts 7 are mounted on the circuit board 6. The circuit board including such electronic components forms a desired control circuit. The space enclosed by the lower side of the circuit board 6 and housing 20 forms a lower space 23.

To close the circuit board 6, the shield case 3 is placed on the circuit board 6. The shield case 3 has a function of cutting off electromagnetic waves. The top panel 1 is placed in the upper direction of the shield case 3. The top plate 1 closes the opening of the chassis 5. The exhaust fan 4 is provided inside of the top panel 1 of the shield case 3.

The frame for wind tunnel 2 is disposed between the shield case 3 and top panel 1. The frame 2 is attached to the top panel 1. Thus, the space between the shield case 3 and the top panel 1 is partitioned by the frame 2. The space enclosed by the shield case 3, top panel 1, and frame 2 forms a wind tunnel 21. The first ventilation hole 9 and first cooling hole 8 communicate with this wind tunnel 21. The frame in this embodiment is a sponge member of rectangular shape. The sponge member is placed in a state being pressed by the top panel 1 and shield case 3.

The first ventilation hole 9 formed on the top of the shield case 3 is formed only in the upper part of the fan 4. The frame for wind tunnel 2 is disposed so as to surround the first ventilation hole 9 and first cooling hole 8. The hot air generated from the heat generating parts 7 is exhausted outside of the housing 20 from the first cooling hole 8 or second cooling hole 51 by the action of the fan 4. The wind tunnel 21 enclosed by the top panel 1, shield case 3 and frame 2 functions as a duct for sucking and exhausting air.

When the fan 4 is rotated so that the wind may be directed upward, the fresh air is sucked into the housing 20 from the second cooling hole 51, and gets into the inner space 22 of the shield case 3 through the second ventilation hole 10. The heat generated in the heat generating parts 7 passes through the second ventilation hole 9, together with the fresh air entering from the inner space 22, and gets into the wind tunnel 21. The hot air getting into the wind tunnel 21, passes through the first cooling hole 8, and is exhausted outside of the housing 20. That is, the heat generated in the heat generating parts 7 is exhausted outside of the housing without circulating again in the housing 20. Thus, the electronic appliance is cooled.

On the other hand, when the fan 4 is rotated so that the wind may be directed downward, the fresh air is sucked into the wind tunnel 21 through the first cooling hole 8, and gets into the inner space 22 through the first ventilation hole 9. Once getting into the inner space, the fresh air is blown against the heat generating parts 7 by the action of the fan 4. Only the cold fresh air sucked in from the first cooling hole 8 is directly blown against the heat generating parts 7. The fresh air blown against the heat generating parts 7 becomes hot air, which is exhausted outside of the housing 20 through the second ventilation hole 10 and second cooling hole 51. Thus, the electronic appliance is cooled.

In this constitution, the heat generated from the circuit board 6 is easily exhausted outside of the housing 20. Accordingly, accumulation of heat in the electronic appliance is prevented. As a result, the electronic appliance is cooled efficiently. Since the wind tunnel 21 functions as a duct, other molded part is not needed as duct. Hence, the cost is reduced.

Besides, since the fan 4 rotates inside of the housing 20, leak of rotating sound by rotation of the fan 4 to outside of the housing 20 is prevented. As a result, the noise level is lowered.

What is claimed is:

1. A cooling structure of electronic appliance having a heat generating part, said cooling structure of an electronic appliance comprising:
    a housing having a top panel, side panels, and a bottom panel,
    a case disposed in said housing,
    a circuit board disposed in said case, in which said circuit board includes said heat generating part, and a space enclosed by said circuit board and case forms an internal space, and
    a frame disposed in the space between said top panel and case, in which the space enclosed by said top panel, case and frame forms a wind tunnel,
    wherein the heat generated in said heat generating part is exhausted outside of said housing by the air passing through said wind tunnel.

2. The cooling structure of electronic appliance of claim 1, wherein said case and circuit board have said circuit board disposed in said housing, and a shield case disposed to enclose said circuit board.

3. The cooling structure of electronic appliance of claim 1, wherein said frame has an elastic member.

4. The cooling structure of electronic appliance of claim 1, wherein at least one of said top panel and bottom panel has a cooling hole.

5. The cooling structure of electronic appliance of claim 1, wherein said case has a first ventilation hole.

6. The cooling structure of electronic appliance of claim 1, wherein said circuit board has a second ventilation hole.

7. The cooling structure of electronic appliance of claim 1, wherein said frame has at least one selected from the group consisting of sponge member, rubber member, hollow rubber member, hollow resin member, resin ring, and rubber ring.

8. The cooling structure of electronic appliance of claim 1, further comprising a fan installed in said case, wherein said heat Is exhausted outside of said housing by the action of said fan.

9. The cooling structure of electronic appliance of claim 1, further comprising a fan installed in said case, wherein said case has a first ventilation hole communicating with said wind tunnel, and said fan is installed at a position corresponding to said first ventilation hole.

10. The cooling structure of electronic appliance of claim 1, further comprising a fan installed in said case,
wherein said housing has a first cooling hole communicating with said wind tunnel, and a second cooling hole communicating with a lower space at the lower side of said circuit board,
said case has a first ventilation hole communicating with said wind tunnel,
said fan is installed at a lower side coinciding with said first ventilation hole, and
said fan has a function of moving the air to pass through the inner space, first ventilation hole, wind tunnel, and first cooling hole.

11. The cooling structure of electronic appliance of claim 1, further comprising a fan installed in said case,
wherein said case and circuit board have said circuit board disposed in said housing, and a shield case disposed to enclose said circuit board,
said housing has a first cooling hole communicating with said wind tunnel, and a second cooling hole communicating with a lower space at the lower side of said circuit board, said shield case has a first ventilation hole communicating with said wind tunnel,
said circuit board has a second ventilation hole, and
a fresh air gets into said wind tunnel through said first cooling hole, and enters the inner space through the first ventilation hole, then it is exhausted outside of the housing by way of said second ventilation hole, lower space and second cooling hole.

12. The cooling structure of electronic appliance of claim 1, further comprising a fan installed in said case,
wherein said case and circuit board have said circuit board disposed in said housing, and a shield case disposed to enclose said, circuit board,
said housing has a first cooling hole communicating with said wind tunnel, and a second cooling hole communicating with a lower space at the lower side of said circuit board,
said shield case has a first ventilation hole communicating with said wind tunnel,
said circuit board has a second ventilation hole, and
a fresh air gets into said inner space through said second cooling hole and second ventilation hole, enters said wind tunnel from said first ventilation hole, and is exhausted outside of said housing through said first cooling hole.

13. The cooling structure of electronic appliance of claim 1, wherein said case has a function of preventing electromagnetic waves.

14. A cooling structure of electronic appliance having a heat generating part, said cooling structure of an electronic appliance comprising:
a housing having a top panel, side panels, and a bottom panel,
a circuit board disposed in said housing, said circuit board having said heat generating part,
a case disposed so as to surround said circuit board, a space enclosed by said circuit board and case forming an internal space, and
a frame disposed in the space between said top panel and case, said frame being made of an elastic member, a space enclosed by said top panel, case and frame forming a wind tunnel, said wind tunnel including a function as a cooling duct,
wherein a heat generated in said heat generating part is exhausted outside of said housing by the air passing through said wind tunnel.

15. The cooling structure of electronic appliance of claim 14, further comprising a fan disposed in said case,
wherein said case has a first ventilation hole communicating with said wind tunnel,
said housing has a first cooling hole communicating with the outside of said housing and said wind tunnel, and
said fan has a function of moving the air to pass through said first ventilation hole, wind tunnel, and first cooling hole.

16. The cooling structure of electronic appliance of claim 15,
wherein said circuit board has a second ventilation hole,
said housing has a second cooling hole to communicate with the lower space positioned at the lower side of said circuit board, and
said fan has a function of moving the air to pass through said first ventilation hole, wind tunnel, first cooling hole, second ventilation hole, lower space, and second cooling hole.

17. The cooling structure of electronic appliance of claim 16,
wherein said fan is installed so that wind may be directly blown against said heat generating parts, and
by an action of said fan, the wind passes through said first cooling hole, wind tunnel, first ventilation hole, inner space, second ventilation hole, lower space, and second cooling hole sequentially, and is exhausted outside of said housing.

18. The cooling structure of electronic appliance of claim 16,
wherein said fan has a function of sending the heat into said wind tunnel, and
by an action of said fan, the wind passes through said second cooling hole, lower space, second ventilation hole, inner space, first ventilation hole, wind tunnel, and first cooling hole sequentially, and is exhausted outside of said housing.

19. The cooling structure of electronic appliance of claim 14, wherein said case has a function of preventing electromagnetic waves.

* * * * *